(12) United States Patent
Yajima et al.

(10) Patent No.: US 6,526,910 B2
(45) Date of Patent: Mar. 4, 2003

(54) APPARATUS AND METHOD FOR FORMING A DEPOSITED FILM BY MEANS OF PLASMA CVD

(75) Inventors: Takahiro Yajima, Souraku-gun (JP); Masahiro Kanai, Tokyo (JP); Takeshi Shishido, Kyotanabe (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/727,440

(22) Filed: Dec. 4, 2000

(65) Prior Publication Data

US 2002/0006476 A1 Jan. 17, 2002

(30) Foreign Application Priority Data

Dec. 3, 1999 (JP) ............................................ 11-344535

(51) Int. Cl.$^7$ ............................................... C23C 16/00
(52) U.S. Cl. .................................... 118/723 E; 427/569
(58) Field of Search ........................ 118/723 E, 723 R; 427/569; 156/345.43, 345.47

(56) References Cited

U.S. PATENT DOCUMENTS 5,031,571 A  7/1991 Igarashi et al. ............. 118/723
5,089,083 A  * 2/1992 Kojima et al. ............... 156/345

FOREIGN PATENT DOCUMENTS

JP  1103828 A2  4/1989
JP  93073327 B4  10/1997

* cited by examiner

Primary Examiner—Thi Dang
(74) Attorney, Agent, or Firm—Fitzpatrick, Cella, Harper & Scinto

(57) ABSTRACT

A film-forming apparatus by means of plasma CVD, comprising at least a vacuum chamber, a power application electrode for introducing a discharging power into said vacuum chamber, and a raw material gas supply means for supplying a film-forming raw material gas into said vacuum chamber, said power application electrode being arranged in said vacuum chamber so as to oppose to a substrate arranged in said vacuum chamber, characterized in that said power application electrode has a reinforcing member or said power application electrode comprises a power application electrode with no reinforcing member which has a thickness which is greater than a distance between said substrate and said power application electrode. A film-forming method using said film-forming apparatus.

30 Claims, 10 Drawing Sheets

F I G. 1
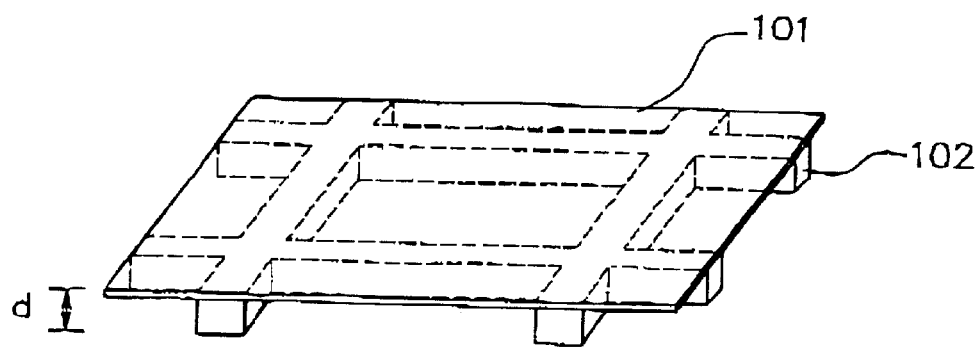

F I G. 7
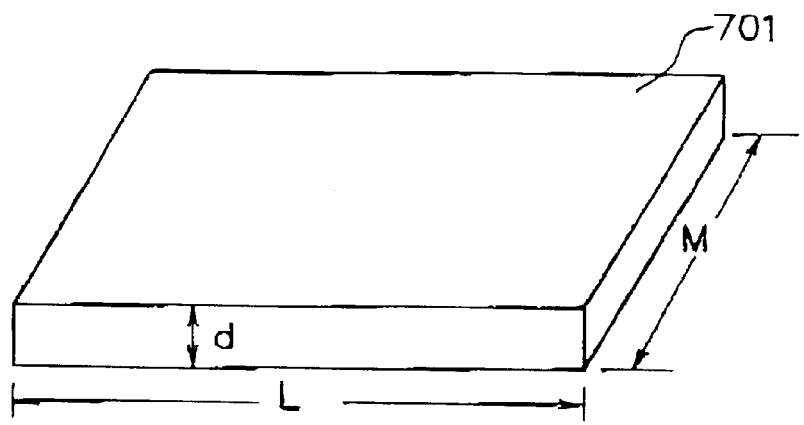

F I G. 8
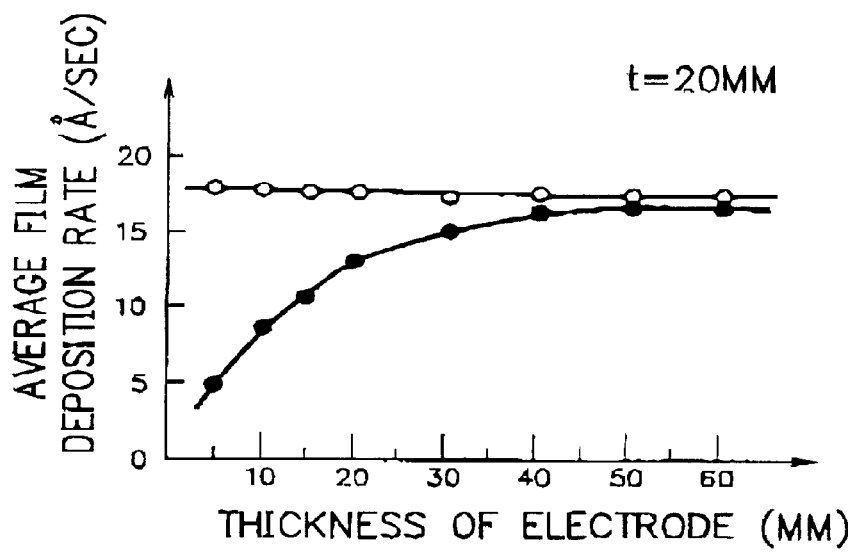

APPARATUS AND METHOD FOR FORMING A DEPOSITED FILM BY MEANS OF PLASMA CVD

BACKGROUND OF THE INVENTION

1. Field of the Invention

The present invention relates to a film-forming apparatus and a film-forming method for forming a deposited film usable in the production of a semiconductor device such as a photovoltaic element including a solar cell by means of plasma chemical vapor deposition (hereinafter referred to as plasma CVD) and using an improved power application electrode capable of being stably maintained without suffering from deformation due to thermal expansion thereof, plasma radiation thereto, or film deposition thereon.

2. Related Background Art

As a typical example of an electronic device in which a photovoltaic element is used, there can be mentioned a solar cell which converts sunlight energy or other light energy into electric energy. Recently, public attention has focused on the power generation system using a solar cell since the solar cell has advantages such that it is safe, can be readily handled and that it can be used as a power generation source of providing clean energy without causing $CO_2$ buildup.

Separately, there have proposed a variety of amorphous semiconductor materials capable of being used in the production of an electronic device including a solar cell. Of these amorphous semiconductor materials, attention has riveted to amorphous silicon (a-Si) semiconductor materials since they have advantages such that they can be readily formed in a thin film having a large area with a relatively large design freedom with respect to the composition, they can be readily controlled in a wide range with respect to their electric and optical characteristics, and therefore, they are suitable as constituents of various electronic devices including solar cells. Particularly, a film comprising such a-Si semiconductor material (hereinafter referred to as "a-Si film") is more advantageous in comparison with a film comprising a crystalline silicon semiconductor material (hereinafter referred to as "crystalline Si film"). That is, the a-Si film has an absorption coefficient against an energy near the energy distribution peak of sunlight which is greater than that of the crystalline Si film, the a-Si film can be formed at a lower film-forming temperature (substrate temperature) than that in the formation of the crystalline Si film, and the a-Si film can be directly formed on a given substrate from a silicon-containing raw material by way glow discharge. In view of this, the a-Si film has been generally recognized as being suitable as a constituent of a solar cell and in fact, it has been widely using in the production of a solar cell.

Now, for a solar cell which has been considered to be important as a part of the future energy measure, it is an immediate necessity in terms of the research and development to lower the production cost and to more improve the performance. In order to attain the production of a solar cell at a desirably low production cost, attention has riveted to an amorphous silicon (a-Si) semiconductor material capable of readily formed in a thin film state. Hitherto, there have been proposed various a-si semiconductor films having a relatively high photoelectric conversion efficiency in terms of the performance. However, these a-si semiconductor films are still insufficient in terms of lowering the production cost. As one of the reasons for this, there can be mentioned a subject in that their film-forming speed (their deposition rate) is slow. For instance, in the case of producing a p-i-n junction type solar cell by means of a glow discharge decomposition method, its i-type semiconductor layer is generally formed at a deposition rate of 0.1 to 2 Å/sec which is relatively slow. In this case, in order to complete the formation of the i-type semiconductor layer having a thickness of 4000 Å, it takes about 30 minutes to about 2 hours which is relatively a long period of time. As a method of forming such a-Si semiconductor layer having a relatively large thickness at a high deposition rate, there has been an attempt in that 100% $SiH_4$ gas or 100% $Si_2H_o$ gas is used. Besides, Japanese Patent Publication No. 56850/1993 discloses that the deposition rate of a deposited film can be increased by shortening the distance between a power application electrode (a counter electrode) and a substrate capable of being served as an electrode.

Incidentally, in the case of forming a thin film of a semiconductor material (a semiconductor thin film) on a substrate using a film-forming apparatus by means of plasma CVD (this apparatus will be hereinafter referred to as "plasma CVD film-forming apparatus") having a discharge space and a power application electrode, in order to make the semiconductor thin film formed on the substrate to have desired optical and electric properties, not only the substrate but also the discharge space including the power application electrode are heated to maintained at a given temperature. In addition, during the film formation, electrons and ions accelerated by the plasma discharge are collided with the substrate and the power application electrode to increase the temperature of the substrate and that of the power application electrode. In the case where the power application electrode comprises a single power application electrode, there is an occasion in that the power application electrode is thermally expanded due to the thermal energy caused by aforesaid electrons and ions to warp, bend or curve and as a result, the power application electrode is deformed to differ from the form of the power application electrode maintained at room temperature, where the distribution of the plasma generated becomes uneven. Separately, in the case where a semiconductor thin film is formed on a substrate using the foregoing plasma CVD film-forming apparatus, there is an occasion in that a film is deposited also on the power application electrode besides on the substrate and the power application electrode is deformed by virtue of a stress of the film deposited thereon.

Japanese Patent Publication No. 73327/1993 discloses a manner to prevent the occurrence of such problems in the plasma CVD film-forming apparatus. Particularly, in this document, there is described a contrivance in that the semiconductor electrode comprises a plurality of divisional electrodes arranged to have a relatively large interval between adjacent divisional electrodes which are electrically connected with a connector capable of varying their intervals, so that the distribution of the plasma generated is prevented from becoming uneven due to such deformation of the power application electrode as described in the above.

Now, it is considered that the deformation due to such thermal expansion and plasma radiation will occurred also at the substrate. However, as long as the substrate is fixed to a substrate holder, the substrate is not deformed. The substrate holder is usually provided with a heater and the like, and it has a size which is considerably larger than that of the substrate. Thus, the substrate holder is hardly deformed.

Separately, in the case where the substrate comprises an elongated web substrate which is transported to pass through one or more discharge spaces without being held by such substrate holder as above described, by fixing the web substrate by sucking its end portions by means of magnets or by virtue of the strength of a tensile force applied thereon, the web substrate can be prevented from being warped or deformed to a certain extent.

The influence which is given by such deformation of the power application electrode is small in the case where the distance between the substrate and the power application electrode is relatively small. However, in the case where the distance between the substrate and the power application electrode is shortened so as to increase the deposition rate of a film deposited on the substrate, there is an occasion in that even the power application electrode is deformed to a slight extent, such slight deformation of the power application electrode brings about a difference which cannot be disregarded in the distance between the substrate and the power application electrode, where unevenness is occurred in the distribution of the plasma generated to cause a partial difference for the film deposition rate.

SUMMARY OF THE INVENTION

An principal object of the present invention is to eliminate the foregoing problems in the prior art and to provide a film-forming apparatus by means of plasma CVD which has an improved power application electrode capable of stably maintained without suffering from deformation such as warping or curving due to thermal expansion thereof, plasma radiation thereto or film deposition thereon during film formation and a film-forming method by means of plasma CVD using said power application electrode.

Another object of the present invention is to provide a film-forming apparatus comprising at least a substantially enclosed vacuum chamber whose inside being capable of being evacuated, a power application electrode for introducing a discharging power into said vacuum chamber, and a raw material gas supply means for supplying a film-forming raw material gas into said vacuum chamber, said power application electrode being arranged in said vacuum chamber so as to oppose to a substrate arranged in said vacuum chamber. Wherein a prescribed film-forming raw material gas is supplied into said vacuum chamber through said raw material gas supply means and simultaneously with this, a prescribed discharging power is introduced into said vacuum chamber through said power application electrode to generate a plasma between said power application electrode and said substrate whereby decomposing said film-forming raw material gas to cause deposition of a film on said substrate, characterized in that said power application electrode has a reinforcing member for preventing said power application electrode from being deformed during the film formation.

A further object of the present invention is to provide a film-forming method comprising the steps of arranging a substrate on which a film is to be formed in a substantially enclosed vacuum chamber whose inside being capable of being evacuated of a film-forming apparatus having a power application electrode arranged in said vacuum chamber so as to oppose said substrate and a raw material gas supply means for supplying a film-forming raw material gas into said vacuum chamber, supplying a prescribed film-forming raw material gas into said vacuum chamber through said raw material gas supply means, and simultaneously with this, introducing a prescribed discharging power into said vacuum chamber through said power application electrode to generate a plasma between said power application electrode and said substrate whereby decomposing said film-forming raw material gas to cause deposition of a film on said substrate, wherein said power application electrode has a reinforcing member for preventing said power application electrode from being deformed during the film formation.

A further object of the present invention is to provide a film-forming apparatus comprising at least a substantially enclosed vacuum chamber whose inside being capable of being evacuated, a power application electrode for introducing a discharging power into said vacuum chamber, and a raw material gas supply means for supplying a film-forming raw material gas into said vacuum chamber, said power application electrode being arranged in said vacuum chamber so as to oppose to a substrate arranged in said vacuum chamber, wherein a prescribed film-forming raw material gas is supplied into said vacuum chamber through said raw material gas supply means and simultaneously with this, a prescribed discharging power is introduced into said vacuum chamber through said power application electrode to generate a plasma between said power application electrode and said substrate whereby decomposing said film-forming raw material gas to cause deposition of a film on said substrate, characterized in that said power application electrode has a thickness (d) which is greater than a distance (t) between said substrate and said power application electrode so that said power application electrode is prevented from being deformed during the film formation.

A further object of the present invention is to provide a film-forming method comprising the steps of arranging a substrate on which a film is to be formed in a substantially enclosed vacuum chamber whose inside being capable of being evacuated of a film-forming apparatus having a power application electrode arranged in said vacuum chamber so as to oppose said substrate and a raw material gas supply means for supplying a film-forming raw material gas into said vacuum chamber, supplying a prescribed film-forming raw material gas into said vacuum chamber through said raw material gas supply means, and simultaneously with this, introducing a prescribed discharging power into said vacuum chamber through said power application electrode to generate a plasma between said power application electrode and said substrate whereby decomposing said film-forming raw material gas to cause deposition of a film on said substrate, wherein said power application electrode has a thickness (d) which is greater than a distance (t) between said substrate and said power application electrode so that said power application electrode is prevented from being deformed during the film formation.

BRIEF DESCRIPTION OF THE DRAWINGS

FIG. 1 is a schematic diagram illustrating the constitution of an example of a power application electrode which is used in a film-forming apparatus of the present invention.

FIG. 7 is a schematic diagram illustrating the constitution of a further example of a power application electrode which is used in a film-forming apparatus of the present invention.

FIG. 8 is a graph showing average deposition rate distributions of deposited films formed on substrates in Example 3 which will be described later, wherein the distance (t) between a power application electrode and a substrate was made to be constant at 20 mm and the thickness (d) of said power application electrode was varied.

DESCRITION OF THE INVENTION AND PREFERRED EMBODIMENTS

Figure 2:
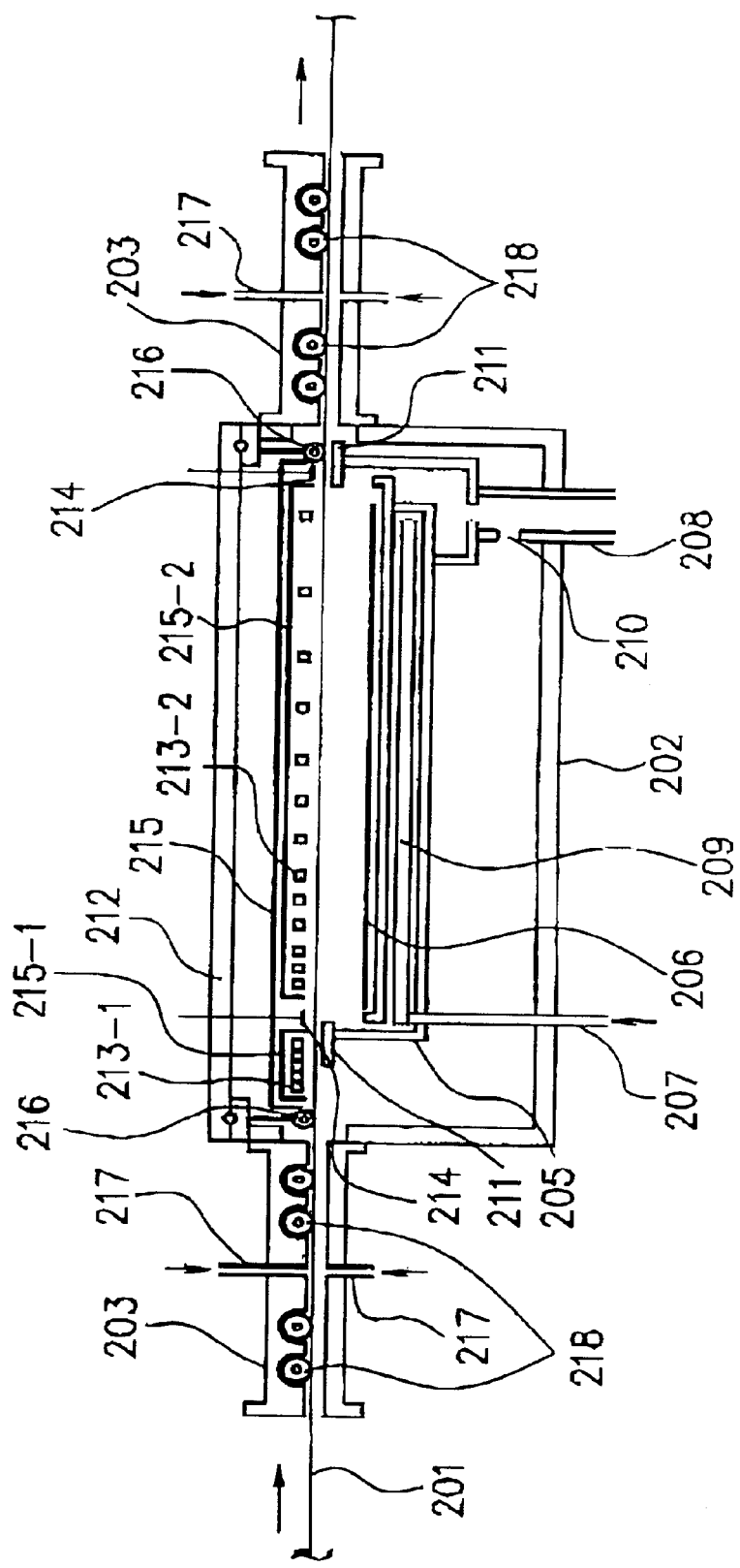
FIG. 2 is a schematic diagram illustrating the constitution of an example of a film-forming apparatus of the present invention.

The present invention eliminates the foregoing problems found in the prior art and attain the above described objects.

As previously described, the present invention includes a first aspect including a film-forming apparatus and method by means of plasma CVD and a second aspect including a film-forming apparatus and method by means of plasma CVD.

The film-forming apparatus in the first aspect of the present invention comprises at least a substantially enclosed vacuum chamber whose inside being capable of being evacuated, a power application electrode for introducing a discharging power into said vacuum chamber, and a raw material gas supply means for supplying a film-forming raw material gas into said vacuum chamber, said power application electrode being arranged in said vacuum chamber so as to oppose to a substrate arranged in said vacuum chamber, wherein a prescribed film-forming raw material gas is supplied into said vacuum chamber through said raw material gas supply means and simultaneously with this, a prescribed discharging power is introduced into said vacuum chamber through said power application electrode to generate a plasma between said power application electrode and said substrate whereby decomposing said film-forming raw material gas to cause deposition of a film on said substrate, characterized in that said power application electrode has a reinforcing member for preventing said power application electrode from being deformed during the film formation.

The film-forming method in the first aspect of the present invention comprises the steps of arranging a substrate on which a film is to be formed in a substantially enclosed vacuum chamber whose inside being capable of being evacuated of a film-forming apparatus having a power application electrode arranged in said vacuum chamber so as to oppose said substrate and a raw material gas supply means for supplying a film-forming raw material gas into said vacuum chamber, supplying a prescribed film-forming raw material gas into said vacuum chamber through said raw material gas supply means, and simultaneously with this, introducing a prescribed discharging power into said vacuum chamber through said power application electrode to generate a plasma between said power application electrode and said substrate whereby decomposing said film-forming raw material gas to cause deposition of a film on said substrate, wherein said power application electrode has a reinforcing member for preventing said power application electrode from being deformed during the film formation.

The reinforcing member is preferred to be provided at a back side of a face of the power application electrode which is opposed to the substrate. In this case, the reinforcing member may be provided at an end portion of the power application electrode or it may be provided along a diagonal line of the power application electrode.

In any case, the reinforcing member is preferred to have a thickness which is greater than that of the power application electrode.

It is preferred that the reinforcing member has a length which is substantially the same as at least one edge of the power application electrode and the reinforcing member is provided in parallel to said edge.

It is preferred that the power application electrode has a portion at an end portion of the power application electrode, where said portion has a thickness which is greater than an average thickness of the power application electrode. It is preferred that the power application electrode has a portion on the diagonal line of the power application electrode, where said portion has a thickness which is greater than the average thickness of the power application electrode.

It is preferred that a maximum value (d) of the thickness of the power application electrode having the reinforcing member attached thereto is greater than a distance (t) between the power application electrode and the substrate. It is preferred that the relationship between said maximum value (d) and said distance (t) satisfies the equation $d \cdot t \geq 400$.

The film-forming apparatus in the second aspect of the present invention comprises at least a substantially enclosed vacuum chamber whose inside being capable of being evacuated, a power application electrode for introducing a discharging power into said vacuum chamber, and a raw material gas supply means for supplying a film-forming raw material gas into said vacuum chamber, said power application electrode being arranged in said vacuum chamber so as to oppose to a substrate arranged in said vacuum chamber, wherein a prescribed film-forming raw material gas is supplied into said vacuum chamber through said raw material gas supply means and simultaneously with this, a prescribed discharging power is introduced into said vacuum chamber through said power application electrode to generate a plasma between said power application electrode and said substrate whereby decomposing said film-forming raw material gas to cause deposition of a film on said substrate, characterized in that said power application electrode has a thickness (d) which is greater than a distance (t) between said substrate and said power application electrode so that said power application electrode is prevented from being deformed during the film formation.

The film-forming method in the second aspect of the present invention comprises the steps of arranging a substrate on which a film is to be formed in a substantially enclosed vacuum chamber whose inside being capable of being evacuated of a film-forming apparatus having a power application electrode arranged in said vacuum chamber so as to oppose said substrate and a raw material gas supply means for supply a film-forming raw material gas into said vacuum chamber, supplying a prescribed film-forming raw material gas into said vacuum chamber through said raw material gas supply means, and simultaneously with this, introducing a prescribed discharging power into said vacuum chamber through said power application electrode to generate a plasma between said power application electrode and said substrate whereby decomposing said film-forming raw material gas to cause deposition of a film on said substrate, wherein said power application electrode has a thickness (d)

which is greater than a distance (t) between said substrate and said power application electrode so that said power application electrode is prevented from being deformed during the film formation.

The relationship between said thickness (d) and said distance (t) is preferred to satisfy the equation d·t≧400. And it is preferred for said distance (t) to be in a range of 5 mm to 50 mm.

In the present invention, the power application electrode is electrically connected to a power source such as a direct current (D.C.) power source, a low frequency power source, a high frequency power source, or a very high frequency (VHF) power source. The discharging power introduced into the vacuum chamber through the power application electrode may comprise an electric power selected from a group consisting of a D.C. power, a low frequency power with an oscillation frequency in a range of 5 kHz to less than 500 kHz, a high frequency power with an oscillation frequency in a range of 500 kHz to less than 30 MHz, and a VHF power with an oscillation frequency in a range of 30 MHz to about 500 MHz.

In the present invention, the vacuum chamber is provided with an exhaust pipe in order to evacuate the inside of the vacuum chamber. The exhaust pipe is provided with a throttle valve and is connected to a vacuum pump.

In the present invention, the inner pressure (the gas pressure) of the vacuum chamber upon the film formation is preferred to be in a range of 0.5 mTorr to 10 Torr.

In the following, the present invention will be described in more detail, if necessary with reference to the drawings.

As above described, a principal feature of the present invention resides in a power application electrode provided in a vacuum chamber for the formation of a deposited film on a substrate arranged in said vacuum chamber by means of plasma CVD, which is structured so that said power application electrode is prevented from suffering from deformation such as warping or curving due to thermal expansion thereof, plasma radiation thereto, or film deposition thereon during the film formation on the substrate. In a typical embodiment, a reinforcing member is provided at a back side of a face of the power application electrode which is opposed to the substrate. According to this electrode structure, because the face of the power application electrode at which the reinforcing member is provided is situated on the back side of the face of the power application electrode which is opposed to the substrate, the magnitude of the reinforcing member does not influence to the distance between the power application electrode and the substrate. Specifically, the arrangement of the reinforcing member may be made such that the reinforcing member is situated at an end portion of the power application electrode or such that the reinforcing member is situated on the diagonal line of the power application electrode, where it is possible to effectively prevent the power application electrode from suffering from deformation such as warping or curving during the film formation on the substrate.

In the present invention, it is possible to effectively prevent the power application electrode from suffering from deformation such as warping or curving by designing the power application electrode to have such a thickness distribution that is enhanced at an end portion of the power application electrode or on a diagonal line of the power application electrode so as to be greater than the average thickness of the power application electrode.

In the case where the distance (t) between the power application electrode and the substrate is shortened in order to increase the deposition rate for a film deposited on the substrate, when the power application electrode is deformed, there is a tendency in that the influence owing to the deformation of the power application electrode to said shortened distance (t) becomes significant. In the present invention, the influence owing to deformation of the power application electrode to the shortened distance (t) between the power application electrode and the substrate can be desirably diminished by making the power application electrode have a thickness (d) which is greater than said distance (t).

In the present invention, when a maximum value of the thickness of the power application electrode or of a body comprising the power application electrode affixed with the reinforcing member is made to be d (mm) and the distance between the substrate and the power application electrode or the body comprising the power application electrode affixed with the reinforcing member is made to be t (mm), by making the relationship between said d (mm) and said t (mm) to satisfy the equation d·t≧400 mm$^2$, it is possible to make the power application electrode have a sufficient thickness such that the power application electrode does not suffer from deformation.

By adopting such constitution as above described for the power application electrode, it is possible that the power application electrode is effectively prevented from suffering from deformation such as warping or curving, a uniform plasma is efficiently generated, and deposition of a film on the substrate proceeds at a desirably uniform deposition rate, even in the case where the distance between the power application electrode and the substrate is shortened.

FIG. 2 is a schematic diagram illustrating the constitution of a principal part of a capacitive coupling type film-forming apparatus as an example of a film-forming apparatus of the present invention. For the apparatus shown in FIG. 2, detailed description will be made later.

Reference numeral 206 in FIG. 2 indicates a power application electrode which is corresponding to the above-described power application electrode. As well as in the above description, the electrode 206 is arranged to oppose a web substrate 201 (which is corresponding to the above described substrate) which functions also as an electrode in FIG. 2.

In the apparatus shown in FIG. 2, the electrode 206 is electrically connected to a desired power source (not shown in the figure), as well as in the above description.

In any case, in the present invention, as previously described, a discharging power comprising an electric power selected from a group consisting of a D.C. power, a low frequency power with an oscillation frequency in a range of 5 kHz to less than 500 kHz, a high frequency power with an oscillation frequency in a range of 500 kHz to less than 30 MHz, and a VHF power with an oscillation frequency in a range of 30 MHz to about 500 MHz is introduced into the vacuum chamber containing a desired film-forming raw material gas therein through the power application electrode to generate a plasma whereby decomposing the raw material gas to cause deposition of a film on the substrate arranged in the vacuum chamber.

The power application electrode may be constituted by a metallic material having a low electric resistance such as Al, Fe, or a stainless steel. Similarly, the reinforcing member may be constituted by a metallic material having a low electric resistance such as Al, Fe, or a stainless steel.

The substrate may be a member made of a translucent insulating material such as glass or the like or a member made of a non-translucent electrically conductive material such as stainless steel or the like. Any of these members may be attached onto an appropriate substrate holder. Besides, the substrate may be an elongated web substrate comprising a flexible insulating member such as a polymer film or the like having an electrically conductive thin film formed thereon or a flexible electrically conductive member made of stainless steel or the like.

It is preferred that the reinforcing member has a thickness which is greater than that of the power application electrode. It is preferred that the reinforcing member has a length which is substantially the same as that of at least an edge of the power application electrode. It is preferred that the reinforcing member is arranged in parallel to said edge of the power application electrode or in parallel to the diagonal line of the power application electrode.

For the distance (t) between the power application electrode and the substrate, it is preferred to be 50 mm or less in order to increase the deposition rate for a film deposited on the substrate, and it is preferred to be 5 mm or more in order to attain more stable plasma discharge. It is more preferred for the distance (t) to be in a range of 10 mm to 30 mm.

For the thickness (d) of the power application electrode or the body comprising the power application electrode affixed with the reinforcing member, it is preferably 20 mm or more or more preferably, 50 mm or more when the distance (t) between the power application electrode and the substrate is 20 mm. When the distance (t) is 30 mm, the thickness (d) is preferably 15 mm or more or more preferably, 30 mm or more.

When the distance (t) is 50 mm, although occurrence of deformation at the power application electrode does not become so problematic, the thickness (d) is preferably 10 mm or more. Here, when d·t is defined to equal A (that is, d·t=A), by making the A to be more than 40 $mm^2$, the thickness (d) of the power application electrode becomes a sufficient thickness such that the power application electrode is hardly deformed. It is more preferred that the A is 1000 $mm^2$ or more.

It is not adequate to increase the thickness (d) simply by thickening the power application electrode (or the reinforcing member). When the thickness is made to be excessively large, the power application electrode (or the reinforcing member) becomes undesirably heavy to result in an increase in the cost of the apparatus and also in a reduction in the maintenance efficiency. In this respect, the thickness (d) is desired to be preferably 500 mm or less or more preferably 200 mm or less. That is, in the equation d=A/t, it is desired for the A to be preferably 5000 or less or more preferably 2000 or less. When the thickness (d) is made to fall in the above range, by subjecting a gaseous mixture comprising silane gas such as $SiH_4$ gas or $Si_2H_6$ gas mixed with a dilution gas such as $H_2$ or He gas to plasma discharging decomposition in the vacuum chamber, it is possible to effectively form a non-single crystal thin film comprising an amorphous silicon material or a polycrystalline silicon material on the substrate.

For the inner pressure (the gas pressure) of the vacuum chamber upon the film formation on the substrate, it is preferred to be 0.5 mTorr to 10 Torr.

In the following, the present invention will be described in more detail with reference to examples, which are only for illustrative purposes but not intended to restrict the scope of the present invention to these examples.

In each of the following examples, description will be made of a case of forming an amorphous silicon thin film on an elongated web substrate using the film-forming apparatus shown in FIG. 2.

As previously described, FIG. 2 is a schematic diagram illustrating the constitution of a principal part of a capacitive coupling type film-forming apparatus as an example of a film-forming apparatus of the present invention.

In FIG. 2, there is shown only one vacuum vessel (vacuum chamber) for the simplification purpose.

In FIG. 2, reference numeral 202 indicates a vacuum vessel (or a vacuum chamber) in a rectangular form which is situated between adjacent vacuum vessels (not shown) positioned on either sides of the vacuum vessel 202, where the vacuum vessel 202 is communicated with each adjacent vacuum vessel through a gas gate 203 provided with a separation gas introduction pipe 217. The adjacent vacuum vessel positioned on the left side (in the figure) may be a vacuum vessel having the same structure as the vacuum vessel 202 or a substrate-loading vacuum vessel from which a substrate is delivered. Similarly, the adjacent vacuum vessel positioned on the right side (in the figure) may be a vacuum vessel having the same structure as the vacuum vessel 202 or a substrate-unloading vacuum vessel which takes up a substrate.

Reference numeral 205 indicates a discharge chamber in a rectangular form which is provided in the vacuum vessel 202. Reference numeral 201 indicates a web substrate which is transported from the adjacent vacuum vessel (not shown) positioned on the left side (in the figure) of the vacuum vessel 202 while passing through the gas gate 203 to enter in the vacuum vessel 202 where the web substrate is situated to cover the top open face of the discharge chamber 205, then the web substrate 201 is carried out from the vacuum vessel 202 to enter in the adjacent vacuum vessel (not shown) positioned on the right side (in the figure) of the vacuum vessel 202 while passing through the gas gate 203 on the right side of the vacuum vessel 202.

The discharge chamber 205 is provided with a gas feed pipe 207 for supplying a raw material gas into the discharge chamber. The gas feed pipe 207 is extending from a raw material gas supply system (not shown). The discharge chamber 205 is also provided with an exhaust pipe 208 which is connected to a vacuum pump (not shown) through a throttle valve (not shown). The exhaust pipe 208 is provided with an exhaustion port 210 which is open outside the discharge chamber 205.

Reference numeral 206 indicates a plane parallel plate type power application electrode which is provided in the discharge chamber 205. The power application electrode 206 is provided so as to oppose the surface of the web substrate 201 which is faced to the inside space of the discharge chamber 205, where the power application electrode 206 functions as a counter electrode to the web substrate 201 which functions as an electrode. The power application electrode 206 is electrically connected to a high frequency power source (not shown) in this embodiment. Reference numeral 209 indicates a block heater which is provided on the back side of the power application electrode 206 in the discharge chamber 205.

Reference numeral 213-1 indicates a preheating means comprising a lamp heater unit which is arranged in the vacuum vessel 202 as shown in FIG. 2, and reference numeral 213-2 indicates a regular heating means comprising a lamp heater unit which is also arranged in the vacuum vessel 202 as shown in FIG. 2. Reference numeral 215-1 indicates a reflector for the preheating means 213-1, reference numeral 215-2 a reflector for the regular heating means 213-2, and reference numeral 215 a reflector for the entirety of the preheating means 213-1 and the regular heating means 213-2. Reference numeral 214 indicates a thermocouple. The preheating means 213-1 serves to provisionally heat the web substrate 201 before the web substrate is entered in the discharge chamber 205. and the regular heating means 213-2 serves to substantially heat the provisionally heated web substrate to a prescribed substrate temperature required for the film formation in the discharge chamber 205.

Reference numeral 218 indicates a magnet roller which is provided along the passage of the gas gate 203 for the web substrate 201. Reference numeral 216 indicates a sustaining roller to sustain the web substrate 201. Reference numeral 212 indicates a cover of the vacuum vessel 202. Reference numeral 211 indicates an opening adjusting member for adjusting an opening of the discharge chamber 205.

Now, the web substrate 201 is transported while being provisionally heated by means of the preheating means 213-1 to enter in the discharge chamber 205, where the web substrate 201 is substantially heated to and maintained at a prescribed temperature by means of the regular heating means 213-2 while adjusting the temperature of the web substrate by means of the thermocouples 214, and the high frequency power source (not shown) is switched on to apply a high frequency power into the discharge chamber 205 through the power application electrode 206 to generate glow discharge in the present of a raw material gas in the discharge chamber where a plasma is generated to decompose the raw material gas whereby causing deposition of a film on the surface of the web substrate 201 which is face to the inside space (the discharge space) of the discharge chamber 205. Specifically in this case, prescribed raw material gas from the raw material gas supply system (not shown) is introduced into the discharge chamber 205 through the gas feed pipe 207, where the raw material gas is heated by means of the block heater 209. At this time, the raw material gas flows in parallel to the transportation direction of the web substrate 201, followed by flowing above the power application electrode 206, then the raw material gas is exhausted by the exhaust pipe 208 outside the discharge chamber 205 then outside the vacuum vessel 202, wherein part of separation gas which is introduced into the gas gate 203 through the separation gas introduction pipe 217 and flown into the discharge chamber 205 and part of the raw material gas introduced into the discharge chamber 205 are exhausted through the exhaustion port 210 provided at the exhaust pipe 208.

EXAMPLE 1

In this example, as the power application electrode 206, there was used an electrode structural body having such configuration as shown in FIG. 1, comprising a power application electrode 101 and a reinforcing member 102 which is affixed to the back face of the power application electrode. Particularly, the electrode structural body was prepared by providing a stainless steel plate having a thickness of 10 mm and a size of 1500 mm×500 mm as the power application electrode 101 and a patterned timber made of a stainless steel having such configuration as shown by numeral reference 102 in FIG. 1 and having a thickness of 50 mm and a width of 50 mm as the reinforcing member 102, arranging the patterned timber on the back face of the stainless steel plate as shown in FIG. 1, and welding the patterned timber and the stainless steel plate to integrate them into a body as the electrode structural body. In the electrode structural body, the proportion of the area of portions as a whole which are larger than the average vale between the maximum thickness value and the minimum thickness value of the electrode structural body to the area of the power application electrode 101 is 25.3%. "d" in FIG. 1 indicates the sum of the thickness of the power application electrode 101 and the thickness of the reinforcing member 102, and d is 60 mm.

The above electrode structural body was installed in the apparatus shown in FIG. 2 as the power application electrode 206. As the web substrate 201, there was used an elongated web substrate made of a stainless steel. And film formation on the web substrate in the apparatus shown in FIG. 2 was conducted in accordance with the foregoing procedures. Specifically, a gaseous mixture comprising $SiH_4$ gas and $H_2$ gas was introduced into the discharge chamber 205 through the gas feed pipe 207, and a high frequency power with a frequency of 13.56 MHz was applied into the discharge chamber 205 through the power application electrode (101) of the electrode structural body to generate a plasma in the discharge chamber 205 whereby forming an amorphous silicon deposited film on the surface of the web substrate 201 which was standing still for 5 minutes. In this case, the distance (t) between the surface of the power application electrode (101) of the electrode structural body and the surface of the web substrate 201 was made to be 20 mm.

Figure 3:
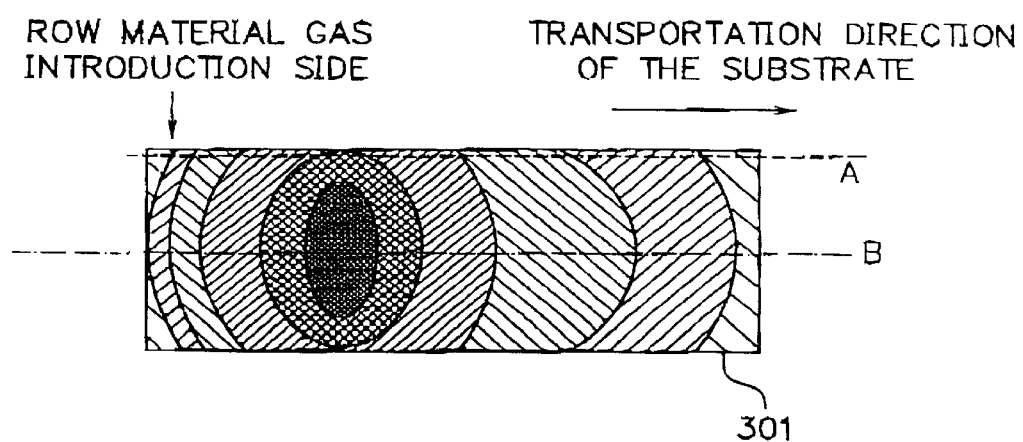
FIG. 3 is a schematic view illustrating an example of a thickness distribution of a deposited film formed on a substrate in Example 1 which will be described later, where said thickness distribution is shown using a constant film thickness line.

In FIG. 3, there is shown a thickness distribution of the amorphous silicon deposited film formed on the web substrate (301) in this example, where said thickness distribution is shown using constant film thickness lines.

Figure 4:
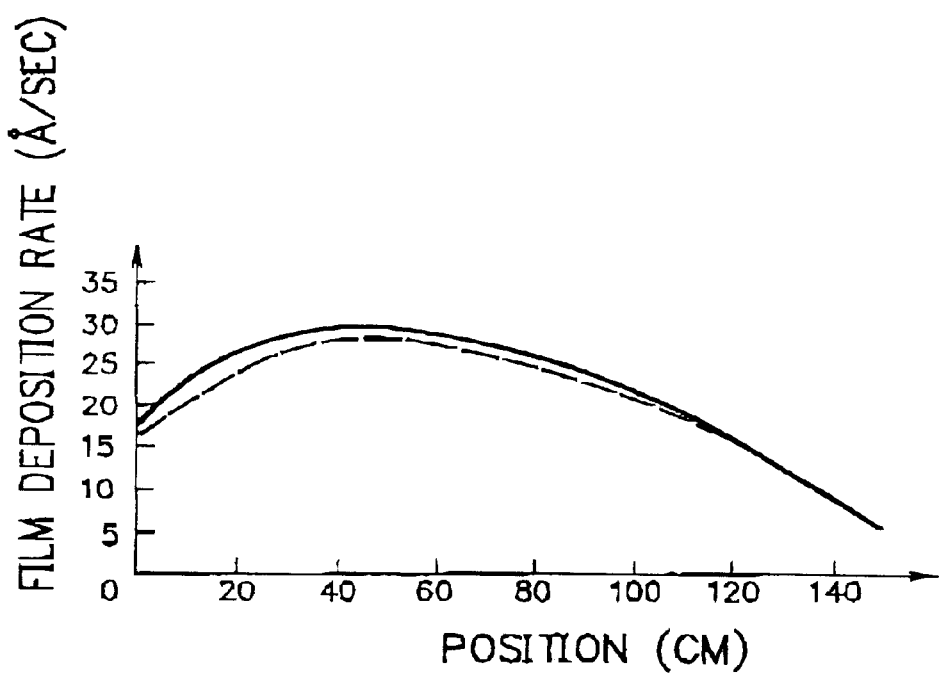
FIG. 4 is a graph showing deposition rate distributions of deposited films formed on substrates in Example 1 which will be described later.

In a central portion (dashed line B) in a width direction on the surface of the web substrate (301) in FIG. 3 and also in an side end portion (broken line A) situated at a position on the surface of the web substrate which is distant by a 10% value of the width of the web substrate from an end of the web substrate in the width direction in FIG. 3, there was examined a distribution of the deposition rate of the amorphous silicon deposited film along the transportation of the web substrate. The examined results obtained are graphically shown in FIG. 4. In FIG. 4, the raw material gas introduction side of the web substrate is made to be a standard position, and the deposition rates of the amorphous silicon deposited film at the positions in the transportation direction of the web substrate starting from the standard position in each case are shown. In FIG. 4, the solid line shows the film deposition rate distribution for the central portion (dashed line B) in FIG. 3, and the broken line shows the film deposition rate distribution for the side end portion (broken line A) in FIG. 3.

There was examined a ratio between the maximum value of the film deposition rate distribution for the central portion (dashed line B) and that of the film deposition rate distribution for the side end portion (broken line A). As a result, the ratio was found to be 5.4%, which is satisfactory.

COMPARATIVE EXAMPLE 1

The procedures of Example 1 were repeated, except that a power application electrode 101 comprising a stainless steel plate having a thickness of 10 mm and a size of 1500 mm×500 mm with no reinforcing member 102 was installed in the apparatus shown in FIG. 2 as the power application electrode 206, to form an amorphous silicon deposited film on the surface of the web substrate 201.

Figure 5:
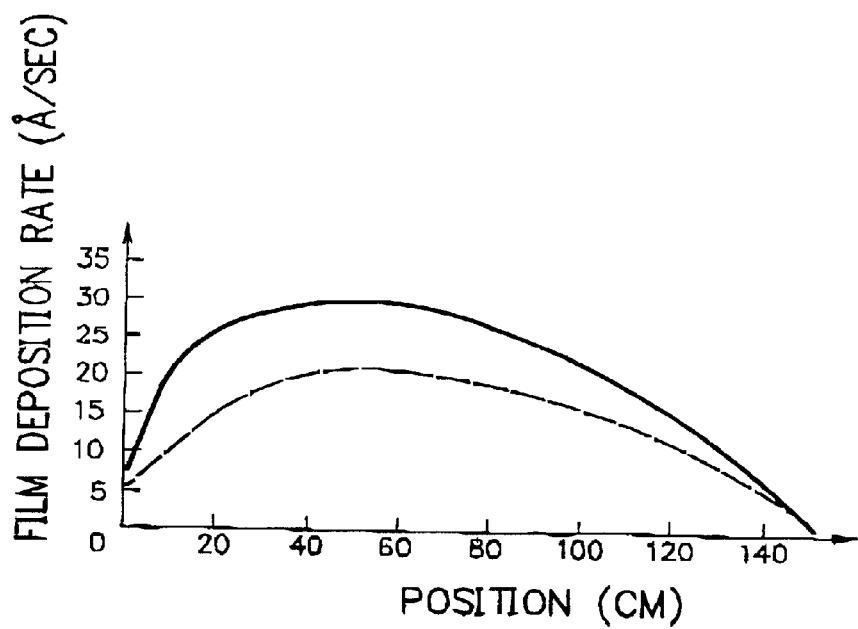
FIG. 5 is a graph showing deposition rate distributions of deposited films formed on substrates in Comparative Example 1 which will be described later.

For the amorphous silicon deposited film formed on the surface of the web substrate 201 in this comparative example, as well as in Example 1, in a central portion (dashed line B) and also in an side end portion (broken line A), there was examined a distribution of the deposition rate of the amorphous silicon deposited film along the transportation of the web substrate. The examined results obtained are graphically shown in FIG. 5. In FIG. 5, the raw material gas introduction side of the web substrate is made to be a standard position, and the deposition rates of the amorphous silicon deposited film at the positions in the transportation direction of the web substrate starting from the standard position in each case are shown. In FIG. 5, the solid line shows the film deposition rate distribution for the central portion (dashed line B), and the broken line shows the film deposition rate distribution for the side end portion (broken line A).

There was examined a ratio between the maximum value of the film deposition rate distribution for the central portion (dashed line B) and that of the film deposition rate distribution for the side end portion (broken line A). As a result, the ratio was found to be 30%, which is markedly large.

For the reason for this, it is considered such that because the power application electrode in this comparative example had no reinforcing member, owing to thermal expansion of the power application electrode, plasma radiation to the power application electrode, or/and film deposition on the power application electrode, the power application electrode was suffered from deformation such as warping or curving to cause a large difference between the film deposition rate distribution in the central portion (dashed line B) and that in the side end portion (broken line A).

EXAMPLE 2

Figure 6:
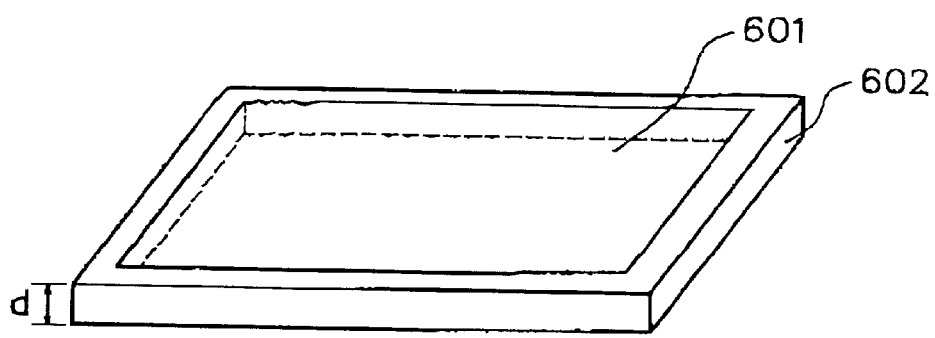
FIG. 6 is a schematic diagram illustrating the constitution of another example of a power application electrode which is used in a film-forming apparatus of the present invention.

The procedures of Example 1 were repeated, except that the electrode structural body having such configuration as shown in FIG. 1 used in Example 1 was changed to an electrode structural body having such configuration as shown in FIG. 6, to form an amorphous silicon deposited film on the surface of the web substrate 201.

Specifically, in this example, as the power application electrode 206 in the apparatus shown in FIG. 2, there was used an electrode structural body having such configuration as shown in FIG. 6, comprising a power application electrode 601 whose circumferential peripheral portion is provided with a reinforcing member 602. Particularly, this electrode structural body was prepared by providing a stainless steel plate having a thickness of 10 mm and a size of 1500 mm×500 mm as the power application electrode 601 and a frame-like patterned timber made of a stainless steel having such configuration as shown by numeral reference 602 in FIG. 6 and having a thickness of 50 mm and a width of 50 mm as the reinforcing member 602, arranging the stainless steel plate and the frame-like patterned timber as shown in FIG. 6, and welding the stainless steel plate and the frame-like patterned timber to integrate them into a body as the electrode structural steel body. In the electrode structural body, the proportion of the area of portions as a whole which are larger than the average vale between the maximum thickness value and the minimum thickness value of the electrode structural body to the area of the power application electrode 601 is 28%. "d" in FIG. 6 indicates the sum of the thickness of the power application electrode 601 and the thickness of the reinforcing member 602, and d is 50 mm.

The above electrode structural body was installed in the apparatus shown in FIG. 2 as the power application electrode 206. And in accordance with the film-forming procedures in Example 1, there was formed an amorphous silicon deposited film on the surface of the web substrate 201. In this case, the distance (t) between the surface of the power application electrode (601) of the electrode structural body and the surface of the web substrate 201 was made to be 20 mm.

For the amorphous silicon deposited film formed on the surface of the web substrate 201 in this example, as well as in Example 1, in a central portion (dashed line B) and also in an side end portion (broken line A), there was examined a distribution of the deposition rate of the amorphous silicon deposited film along the transportation of the web substrate. And there was examined a ratio between the maximum value of the film deposition rate distribution for the central portion (dashed line B) and that of the film deposition rate distribution for the side end portion (broken line A). As a result, the ratio was found to be 5.2%, which is satisfactory as well as in Example 1.

In this example, by using the electrode structural body having a relatively simple structure comprising the power application electrode 601 whose circumferential peripheral portion is provided with the reinforcing member 602 as above described, it was possible to effectively prevent the power application electrode from suffering from deformation such as warping or curving at the peripheral portion thereof whereby restraining occurrence of a variation in the film deposition rate to a minimum level.

EXAMPLE 3

EXAMPLE 3-1

The procedures of Example 1 were repeated, except that the electrode structural body having such configuration as shown in FIG. 1 used in Example 1 was changed to a power application electrode having such configuration as shown in FIG. 7 and which has a large thickness so that the power application electrode exhibits a deformation preventive performance which is equivalent to that which the reinforcing member exhibits, to form an amorphous silicon deposited film on the surface of the web substrate 201.

Specifically, in this example, as the power application electrode 206 in the apparatus shown in FIG. 2, there was used a power application electrode 701 having such configuration as shown in FIG. 7, comprising a stainless steel plate having a thickness of 50 mm and a size of 1500 mm (length: L)×500 mm (width: M). "d" in FIG. 7 indicates the thickness of the power application electrode 701, and d is 50 mm.

The above power application electrode 701 was installed in the apparatus shown in FIG. 2 as the power application electrode 206. And in accordance with the film-forming procedures in Example 1, there was formed an amorphous silicon deposited film on the surface of the web substrate 201. In this case, the distance (t) between the surface of the power application electrode (701) and the surface of the web substrate 201 was made to be 20 mm.

For the amorphous silicon deposited film formed on the surface of the web substrate 201 in this example, as well as in Example 1, in a central portion (dashed line B) and also in an side end portion (broken line A), there was examined a distribution of the deposition rate of the amorphous silicon deposited film along the transportation of the web substrate. And there was examined a ratio between the maximum value of the film deposition rate distribution for the central portion (dashed line B) and that of the film deposition rate distribution for the side end portion (broken line A). As a result, the ratio was found to be 3.0%, which is relatively smaller than that in Example 1.

In this example, by using the power application electrode 701 having a large thickness, there is an disadvantage such that because the power application electrode is relatively heavy, the maintenance efficiency upon replacing the power application electrode by a new power application electrode is reduced. However, it was possible to more effectively prevent the power application electrode from suffering from deformation such as warping or curving at the peripheral portion thereof whereby desirably restraining occurrence of a variation in the film deposition rate to a minimum level.

EXAMPLE 3-2

1. Following the procedures of Example 3-1 except for varying the thickness (d) of the power application electrode in a range of 5 mm to 60 mm under condition of making the electrode-substrate distance (t) to 20 mm, film formation test was conducted for each power application electrode having a different thickness (d). And for the resultant amorphous silicon deposited films each formed on the surface of the web substrate in each case, there were examined an average film deposition rate in (i) a central portion of the deposited film along longitudinal line crossing a central position of the web substrate in the width direction (or along a longitudinal line crossing a central position of the power application electrode in the width (M) direction and an average film deposition rate in (ii) a side end portion of the deposited film along a longitudinal line crossing a side position of the web substrate which is 50 mm distant from the side end in the width direction (or along a longitudinal line crossing a side position of the power application electrode which is 50 mm distant from the side end in the width (M) direction).

The examined results obtained are graphically shown in FIG. 8.

2. Following the procedures of Example 3-1 except for varying the thickness (d) of the power application electrode in a range of 5 mm to 60 mm under condition of making the electrode-substrate distance (t) to 30 mm, film formation test was conducted for each power application electrode having a different thickness (d). And for the resultant amorphous silicon deposited films each formed on the surface of the web substrate in each case, as well as in the above 1, there were examined an average film deposition rate in (i) a central portion of the deposited film and an average film deposition rate of the deposited film in (ii) a side end portion of the deposited film.

Figure 9:
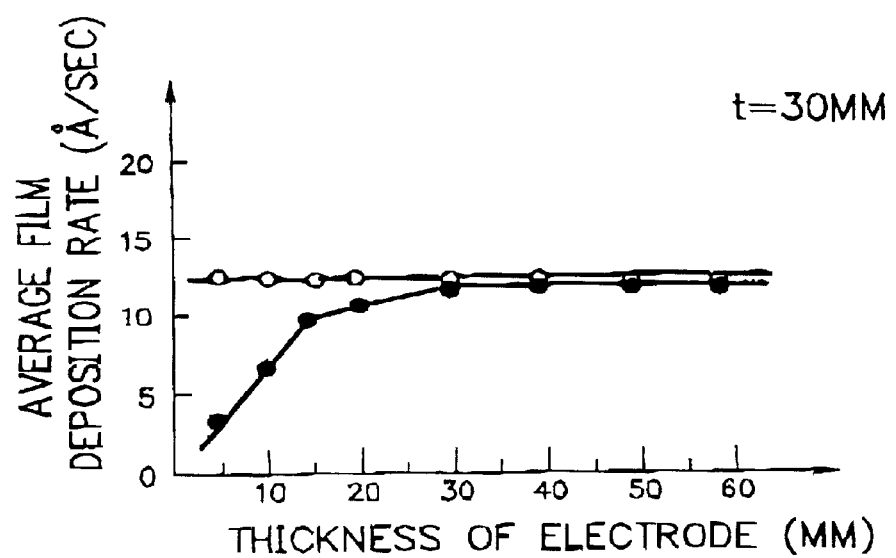
FIG. 9 is a graph showing average deposition rate distributions of deposited films formed on substrates in Example 3 which will be described later, wherein the distance (t) between a power application electrode and a substrate was made to be constant at 30 mm and the thickness (d) of said power application electrode was varied.

The examined results obtained are graphically shown in FIG. 9.

3. Following the procedures of Example 3-1 except for varying the thickness (d) of the power application electrode in a range of 5 mm to 60 mm under condition of making the electrode-substrate distance (t) to 50 mm, film formation test was conducted for each power application electrode having a different thickness (d). And for the resultant amorphous silicon deposited films each formed on the surface of the web substrate in each case, as well as in the above 1, there were examined an average film deposition rate in (i) a central portion of the deposited film and an average film deposition rate of the deposited film in (ii) a side end portion of the deposited film.

Figure 10:
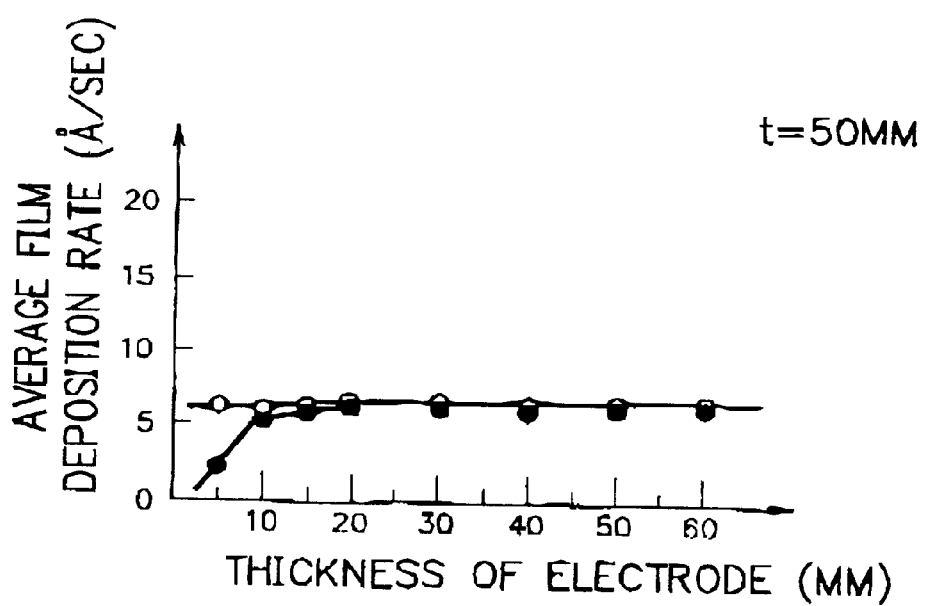
FIG. 10 is a graph showing average deposition rate distributions of deposited films formed on substrates in Example 3 which will be described later, wherein the distance (t) between a power application electrode and a substrate was made to be constant at 30 mm and the thickness (d) of said power application electrode was varied.

The examined results obtained are graphically shown in FIG. 10.

In each of FIGS. 8 to 10, ○ is of the foregoing central portion (i) of the deposited film and ● is of the foregoing side end portion (ii) of the deposited film.

From the results obtained in the above, the following facts are understood.

(1). In the case where the electrode-substrate distance (t) is 20 mm (see, FIG. 8), the average film deposition rate in the central portion (i) is not so changed depending on a change in the thickness (d) of the power application electrode. However, the average film deposition rate in the side end portion (ii) is gradually is decreased from when the thickness (d) of the power application electrode is 40 mm, and it is suddenly decreased when the thickness (d) of the power application electrode is 15 mm or less. For the reason for this situation, it is considered such that when the thickness (d) of the power application electrode is thinner than 50 mm, the power application electrode suffers from deformation such as warping due to thermal expansion of the power application electrode, plasma radiation to the power application electrode, or film deposition on the power application electrode to increase the distance (t) between the web substrate and the power application electrode, whereby the film deposition rate is decreased, and the magnitude of the deformation of the power application electrode becomes increased, abnormal discharge starts occurring between the end portion of the power application electrode, the inner wall face of the discharge chamber and the web substrate to significantly decrease the film deposition rate.

(2). In the case where the electrode-substrate distance (t) is 30 mm (see, FIG. 9), the average film deposition rate in the central portion (i) is smaller than that in the above (1). The average film deposition rate in the central portion (i) not so changed depending on a change in the thickness (d) of the power application electrode. However, the average film deposition rate in the side end portion (ii) is decreased from when the thickness (d) of the power application electrode is less than 30 mm, and it is suddenly decreased when the thickness (d) of the power application electrode is 10 mm or less.

(3). In the case where the electrode-substrate distance (t) is 50 mm (see, FIG. 10), the average film deposition rate in the central portion (i) is smaller than that in the above (2). The average film deposition rate in the central portion (i) not so changed depending on a change in the thickness (d) of the power application electrode. However, the average film deposition rate in the side end portion (ii) starts decreasing from when the thickness (d) of the power application electrode is less than 15 mm, and it is suddenly decreased when the thickness (d) of the power application electrode is 5 mm or less.

Based on the above-described facts, there were obtained the following findings. That is, by increasing the thickness (d) of the power application electrode, it is possible to restrain occurrence of a variation in the film deposition rate. When the electrode-substrate distance (t) is relatively small, it is necessary for the thickness (d) of the power application electrode to be increased. The relationship between the (d) and the (t) can be expressed by the equation $d = A/t$, with A being about 400 or more, preferably 1000.

As detailed in the above description, the present invention provides such significant advantages as will be described below.

As the power application electrode structure, by providing a specific reinforcing member or thickening the thickness of the power application electrode, it is possible to prevent the power application electrode from suffering from deformation such as warping or curving owing to thermal expansion thereof, plasma radiation thereto, or film deposition thereon. Hence, it is possible to improve the uniformity of the plasma generated and restrain occurrence of a variation in the film deposition rate. This situation leads to improving the productivity of a functional deposited film, particularly a large area thin film semiconductor device such as a solar cell at a reasonable production cost.

What is claimed is:

1. A film-forming apparatus comprising at least a substantially enclosed vacuum chamber whose inside being capable of being evacuated, a power application electrode for introducing a discharging power into said vacuum chamber, and a raw material gas supply means for supplying a film-forming raw material gas into said vacuum chamber, said power application electrode being arranged in said vacuum chamber so as to oppose to a substrate arranged in said vacuum chamber, wherein a prescribed film-forming raw material gas is supplied into said vacuum chamber through said raw material gas supply means and simultaneously with this, a prescribed discharging power is introduced into said vacuum chamber through said power application electrode to generate a plasma between said power application electrode and said substrate whereby decomposing said film-forming raw material gas to cause deposition of a film on said substrate, characterized in that said power application electrode has a reinforcing member provided along a diagonal line of said power application electrode for preventing said power application electrode from being deformed during the film formation.

2. The film-forming apparatus according to claim 1, wherein said reinforcing member is provided at a back side of a face of said power application electrode which is opposed to said substrate.

3. The film-forming apparatus according to claim 1, wherein said reinforcing member has a thickness which is greater than that of said power application electrode.

4. The film-forming apparatus according to claim 1, wherein said power application electrode is electrically connected to a power source capable of supplying an electric power selected from a group consisting of a D.C. power, a low frequency power with an oscillation frequency in a range of 5 kHz to less than 500 kHz, a high frequency power with an oscillation frequency in a range of 500 kHz to less than 30 MHz, and a VHF power with an oscillation frequency in a range of 30 MHz to about 500 MHz.

5. The film-forming apparatus according to claim 1, wherein said vacuum chamber is controlled to have an inner pressure of 0.5 mTorr to 10 Torr upon the formation of said film on said substrate.

6. A film-forming apparatus comprising at least a substantially enclosed vacuum chamber whose inside being capable of being evacuated, a power application electrode for introducing a discharging power into said vacuum chamber, and a raw material gas supply means for supplying a film-forming raw material gas into said vacuum chamber, said power application electrode being arranged in said vacuum chamber so as to oppose to a substrate arranged in said vacuum chamber, wherein a prescribed film-forming raw material gas is supplied into said vacuum chamber through said raw material gas supply means and simultaneously with this, a prescribed discharging power is introduced into said vacuum chamber through said power application electrode to generate a plasma between said power application electrode and said substrate whereby decomposing said film-forming raw material gas to cause deposition of the film on said substrate, characterized in that said power application electrode has a portion at an end portion thereof, said portion having a thickness which is greater than an average thickness of said power application electrode.

7. A film-forming apparatus comprising at least a substantially enclosed vacuum chamber whose inside being capable of being evacuated, a power application electrode for introducing a discharging power into said vacuum chamber, and a raw material gas supply means for supplying a film-forming raw material gas into said vacuum chamber, said power application electrode being arranged in said vacuum chamber so as to oppose to a substrate arranged in said vacuum chamber, wherein a prescribed film-forming raw material gas is supplied into said vacuum chamber through said raw material gas supply means and simultaneously with this, a prescribed discharging power is introduced into said vacuum chamber through said power application electrode to generate a plasma between said power application electrode and said substrate whereby decomposing said film-forming raw material gas to cause deposition of the film on said substrate, characterized in that said power application electrode has a portion on a diagonal line of said power application electrode, said portion having a thickness which is greater than an average thickness of said power application electrode.

8. A film-forming apparatus comprising at least a substantially enclosed vacuum chamber whose inside being capable of being evacuated, a power application electrode for introducing a discharging power into said vacuum chamber, and a raw material gas supply means for supplying a film-forming raw material gas into said vacuum chamber, said power application electrode being arranged in said vacuum chamber so as to oppose to a substrate arranged in said vacuum chamber, wherein a prescribed film-forming raw material gas is supplied into said vacuum chamber through said raw material gas supply means and simultaneously with this, a prescribed discharging power is introduced into said vacuum chamber through said power application electrode to generate a plasma between said power application electrode and said substrate whereby decomposing said film-forming raw material gas to cause deposition of the film on said substrate, characterized in that said power application electrode has a reinforcing member and a maximum value (d) of a thickness of a combination of said power application electrode and said reinforcing member attached to said power application electrode is greater than a distance (t) between said power application electrode and said substrate.

9. The film-forming apparatus according to claim 8, wherein a relationship between said maximum value (d) and said distance (t) satisfies the equation $d \cdot t \geq 400$.

10. The film-forming apparatus according to claim 8, wherein said distance (t) is in a range of 5 mm to 50 mm.

11. A film-forming apparatus comprising at least a substantially enclosed vacuum chamber whose inside being capable of being evacuated, a power application electrode for introducing a discharging power into said vacuum chamber, and a raw material gas supply means for supplying a film-forming raw material gas into said vacuum chamber, said power application electrode being arranged in said vacuum chamber so as to oppose to a substrate arranged in said vacuum chamber, wherein a prescribed film-forming raw material gas is supplied into said vacuum chamber through said raw material gas supply means and simultaneously with this, a prescribed discharging power is introduced into said vacuum chamber through said power application electrode to generate a plasma between said power application electrode and said substrate whereby decomposing said film-forming raw material gas to cause deposition of a film on said substrate, characterized in that said power application electrode has a thickness (d) which is greater than a distance (t) between said substrate and said power application electrode.

12. The film-forming apparatus according to claim 11, wherein a relationship between said thickness (d) and said distance (t) satisfies the equation $d \cdot t \geq 400$.

13. The film-forming apparatus according to claim 11, wherein said distance (t) is in a range of 5 mm to 50 mm.

14. The film-forming apparatus according to claim 11, wherein said power application electrode is electrically connected to a power source capable of supplying an electric power selected from a group consisting of a D.C. power, a low frequency power with an oscillation frequency in a range of 5 kHz to less than 500 kHz, a high frequency power with an oscillation frequency in a range of 500 kHz to less than 30 MHz, and a VHF power with an oscillation frequency in a range of 30 MHz to about 500 MHz.

15. The film-forming apparatus according to claim 11, wherein said vacuum chamber is controlled to have an inner pressure of 0.5 mTorr to 10 Torr upon the formation of said film on said substrate.

16. A film-forming method comprising the steps of arranging a substrate on which a film is to be formed in a substantially enclosed vacuum chamber whose inside being capable of being evacuated of a film-forming apparatus having a power application electrode arranged in said vacuum chamber so as to oppose said substrate and a raw material gas supply means for supplying a film-forming raw material gas into said vacuum chamber, supplying a prescribed film-forming raw material gas into said vacuum chamber through said raw material gas supply means, and simultaneously with this, introducing a prescribed discharging power into said vacuum chamber through said power application electrode to generate a plasma between said power application electrode and said substrate whereby decomposing said film-forming raw material gas to cause deposition of a film on said substrate, wherein said power application electrode has a reinforcing member provided along a diagonal line of said power application electrode for preventing said power application electrode from being deformed during the film formation.

17. The film-forming method according to claim 16, wherein said reinforcing member is provided at a back side of a face of said power application electrode which is opposed to said substrate.

18. The film-forming method according to claim 16, wherein said reinforcing member has a thickness which is greater than that of said power application electrode.

19. The film-forming method according to claim 16, wherein said power application electrode is electrically connected to a power source capable of supplying an electric power selected from a group consisting of a D.C. power, a low frequency power with an oscillation frequency in a range of 5 kHz to less than 500 kHz, a high frequency power with an oscillation frequency in a range of 500 kHz to less than 30 MHz, and a VHF power with an oscillation frequency in a range of 30 MHz to about 500 MHz.

20. The film-forming method according to claim 16, wherein said vacuum chamber is controlled to have an inner pressure of 0.5 mTorr to 10 Torr upon the formation of said film on said substrate.

21. A film-forming method comprising the steps of arranging a substrate on which a film is to be formed in a substantially enclosed vacuum chamber whose inside being capable of being evacuated of a film-forming apparatus having a power application electrode arranged in said vacuum chamber so as to oppose said substrate and a raw material gas supply means for supplying a film-forming raw material gas into said vacuum chamber, supplying a prescribed film-forming raw material gas into said vacuum chamber through said raw material gas supply means, and simultaneously with this, introducing a prescribed discharging power into said vacuum chamber through said power application electrode to generate a plasma between said power application electrode and said substrate whereby decomposing said film-forming raw material gas to cause deposition of a film on said substrate, wherein said power application electrode has a portion at an end portion thereof, said portion having a thickness which is greater than an average thickness of said power application electrode.

22. A film-forming method comprising the steps of arranging a substrate on which a film is to be formed in a substantially enclosed vacuum chamber whose inside being capable of being evacuated of a film-forming apparatus having a power application electrode arranged in said vacuum chamber so as to oppose said substrate and a raw material gas supply means for supplying a film-forming raw material gas into said vacuum chamber, supplying a prescribed film-forming raw material gas into said vacuum chamber through said raw material gas supply means, and simultaneously with this, introducing a prescribed discharging power into said vacuum chamber through said power application electrode to generate a plasma between said power application electrode and said substrate whereby decomposing said film-forming raw material gas to cause deposition of a film on said substrate, wherein said power application electrode has a portion on a diagonal line of said power application electrode, said portion having a thickness which is greater than an average thickness of said power application electrode.

23. A film-forming method comprising the steps of arranging a substrate on which a film is to be formed in a substantially enclosed vacuum chamber whose inside being capable of being evacuated of a film-forming apparatus having a power application electrode arranged in said vacuum chamber so as to oppose said substrate and a raw material gas supply means for supplying a film-forming raw material gas into said vacuum chamber, supplying a prescribed film-forming raw material gas into said vacuum chamber through said raw material gas supply means, and simultaneously with this, introducing a prescribed discharging power into said vacuum chamber through said power application electrode to generate a plasma between said power application electrode and said substrate whereby decomposing said film-forming raw material gas to cause deposition of a film on said substrate, wherein a maximum value (d) of a thickness of a combination of said power application electrode and said reinforcing member attached to said power application electrode is greater than a distance (t) between said power application electrode and said substrate.

24. The film-forming method according to claim 22, wherein a relationship between said maximum value (d) and said distance (t) satisfies the equation $d \cdot t \geq 400$.

25. The film-forming method according to claim 23, wherein said distance (t) is in a range of 5 mm to 50 mm.

26. A film-forming method comprising the steps of arranging a substrate on which a film is to be formed in a substantially enclosed vacuum chamber whose inside being capable of being evacuated of a film-forming apparatus having a power application electrode arranged in said vacuum chamber so as to oppose said substrate and a raw material gas supply means for supplying a film-forming raw material gas into said vacuum chamber, supplying a prescribed film-forming raw material gas into said vacuum chamber through said raw material gas supply means, and simultaneously with this, introducing a prescribed discharging power into said vacuum chamber through said power application electrode to generate a plasma between said power application electrode and said substrate whereby decomposing said film-forming raw material gas to cause deposition of a film on said substrate, wherein said power application electrode has a thickness (d) which is greater than a distance (t) between said substrate and said power application electrode.

27. The film-forming method according to claim 26, wherein a relationship between said thickness (d) and said distance (t) satisfies the equation d.t≧400.

28. The film-forming method according to claim 26, wherein said distance (t) is in a range of 5 mm to 50 mm.

29. The film-forming method according to claim 26, wherein said power application electrode is electrically connected to a power source capable of supplying an electric power selected from a group consisting of a D.C. power, a low frequency power with an oscillation frequency in a range of 5 kHz to less than 500 kHz, a high frequency power with an oscillation frequency in a range of 500 kHz to less than 30 MHz, and a VHF power with an oscillation frequency in a range of 30 MHz to about 500 MHz.

30. The film-forming method according to claim 26, wherein said vacuum chamber is controlled to have an inner pressure of 0.5 mTorr to 10 Torr upon the formation of said film on said substrate.

* * * * *

UNITED STATES PATENT AND TRADEMARK OFFICE
CERTIFICATE OF CORRECTION

PATENT NO.   : 6,526,910 B2
DATED        : March 4, 2003
INVENTOR(S)  : Takahiro Yajima et al.

It is certified that error appears in the above-identified patent and that said Letters Patent is hereby corrected as shown below:

Title Page,
Item [56], References Cited, FOREIGN PATENT DOCUMENTS,
"1103828 A2     4/1989" should read -- 1-103828 A2     4/1989 --.

Column 1,
Line 26, "have" should read -- have been --;
Line 48, "way" should read -- way of --;
Line 51, "using" should read -- used --; and
Line 60, "readily" should read -- being readily --.

Column 3,
Line 15, "is occurred" should read -- occurs --; and
Line 19, "An" should read -- A --.

Column 7,
Line 47, "to" should be deleted.

Column 8,
Line 58, "to cause" should read -- causes --.

Column 9,
Line 9, "$Si_2Ho$" should read -- $Si_2H_6$ --;
Line 24, "to" should read -- to be --; and
Line 56, "occurred" should read -- occur --.

Column 11,
Line 5, "205." should read -- 205, --; and
Line 30, "face" should read -- faced --.

Column 12,
Line 67, "an" should read -- a --.

Column 13,
Line 25, "was" should be deleted; and
Line 55, "vale" should read -- value --.

Column 14,
Lines 7, 57 and 67, "an" should read -- a --.

Column 16,
Line 4, "is" (second occurrence) should be deleted.

UNITED STATES PATENT AND TRADEMARK OFFICE
CERTIFICATE OF CORRECTION

PATENT NO. : 6,526,910 B2
DATED : March 4, 2003
INVENTOR(S) : Takahiro Yajima et al.

It is certified that error appears in the above-identified patent and that said Letters Patent is hereby corrected as shown below:

Column 20,
Line 49, "claim 22," should read -- claim 23, --.

Signed and Sealed this

Tenth Day of February, 2004

JON W. DUDAS
*Acting Director of the United States Patent and Trademark Office*